United States Patent
Gonzalez Santos et al.

(10) Patent No.: US 11,496,049 B2
(45) Date of Patent: Nov. 8, 2022

(54) INSTANTANEOUS POWER ESTIMATION IN A CONTINUOUS TIME DIGITAL SIGNAL PROCESSING SYSTEM

(71) Applicants: Universite de Lille, Lille (FR); Centre National De La Recherche Scientifique, Paris (FR); ISEN Yncrea Hauts-de-France, Lille (FR); STMicroelectronics SA, Montrouge (FR)

(72) Inventors: Angel de Dios Gonzalez Santos, Grenoble (FR); Andreas Kaiser, Villeneuve d'Ascq (FR); Antoine Frappe, La Madeleine (FR); Philippe Cathelin, Laval (FR); Benoit Larras, Lille (FR)

(73) Assignees: Universite de Lille, Lille (FR); Centre National De La Recherche Scientifique, Paris (FR); ISEN Yncrea Hauts-de-France, Lille (FR); STMicroelectronics SA, Montrouge (FR)

( * ) Notice: Subject to any disclaimer, the term of this patent is extended or adjusted under 35 U.S.C. 154(b) by 352 days.

(21) Appl. No.: 16/789,589

(22) Filed: Feb. 13, 2020

(65) Prior Publication Data
US 2021/0257908 A1 Aug. 19, 2021

(51) Int. Cl.
| | |
|---|---|
| *H03M 7/30* | (2006.01) |
| *H02M 3/157* | (2006.01) |
| *H02M 5/458* | (2006.01) |
| *G06F 1/03* | (2006.01) |
| *H04B 1/04* | (2006.01) |

(52) U.S. Cl.
CPC .......... *H02M 3/157* (2013.01); *H02M 5/4585* (2013.01); *H03M 7/6047* (2013.01); *G06F 1/03* (2013.01); *H04B 1/04* (2013.01)

(58) Field of Classification Search
CPC ....... G06F 1/03; H02M 3/157; H02M 5/4585; H03M 1/00; H03M 1/12; H03M 1/60; H03M 7/6047; H04B 1/04; H04K 1/02; H04L 25/03
USPC ......... 341/110–150, 155; 375/219, 295–297, 375/316; 455/114.3, 130, 136
See application file for complete search history.

(56) References Cited

U.S. PATENT DOCUMENTS

| | | |
|---|---|---|
| 5,263,487 A | 11/1993 | Sakamoto et al. |
| 5,867,065 A | 2/1999 | Leyendecker |
| 5,923,712 A | 7/1999 | Leyendecker et al. |

(Continued)

OTHER PUBLICATIONS

S. Patil, "Digital Processing of Signals Produced by Voltage-Controlled-Oscillator-Based Continuous-Time ADCs", IEEE (Year: 2016).*

(Continued)

*Primary Examiner* — Shawkat M Ali
(74) *Attorney, Agent, or Firm* — Crowe & Dunlevy

(57) ABSTRACT

A continuous time digital signal processing (CT DSP) token includes a first signal indicating a change has occurred and a second signal indicating a direction of the change. An amplitude generation circuit operates to generate an amplitude value x in response to the token. A power estimation circuit processes the amplitude value x to generate a digital power signal in accordance with the formula: $x^2 \pm 2x + 1$.

36 Claims, 4 Drawing Sheets

(56) References Cited

U.S. PATENT DOCUMENTS

| | | |
|---|---|---|
| 6,496,536 B2 | 12/2002 | Mollenkopf |
| 6,694,129 B2 | 2/2004 | Peterzell et al. |
| 6,721,547 B2 | 4/2004 | Husted et al. |
| 8,023,587 B2 | 9/2011 | Deng et al. |
| 9,300,206 B2 | 3/2016 | Ye et al. |
| 2013/0057423 A1* | 3/2013 | Kurchuk ............... H04R 25/00 341/155 |

OTHER PUBLICATIONS

Schell, Bob et al: "A Continuous-Time ADC/DSP/DAC System With No Clock and With Activity-Dependent Power Dissipation," IEEE Journal of Solid-State Circuits, vol. 43, No. 11, Nov. 2008, pp. 2472-2481.

Li, Yongjia et al: "An ECG Recording Front-End With Continuous-Time Level-Crossing Sampling," IEEE Transactions on Biomedical Circuits and Systems, vol. 8, No. 5, Oct. 2014, pp. 626-635.

Liu, Yan et al: "Clockless Continuous-Time Neural Spike Sorting: Method, Implementation and Evaluation," IEEE 2016, pp. 538-541.

\* cited by examiner

INSTANTANEOUS POWER ESTIMATION IN A CONTINUOUS TIME DIGITAL SIGNAL PROCESSING SYSTEM

TECHNICAL FIELD

The present invention generally relates to the estimation of instantaneous power of a signal and, in particular, to a circuit for use in a continuous time digital signal processing system to estimate the instantaneous power of a signal.

BACKGROUND

Continuous time digital signal processing (CT DSP) is a clock-less event driven technique for processing an analog information signal (for example, an audio signal or an environmental signal or other sensor or transducer output signal). With reference to a CT DSP system 10 as shown in FIG. 1, the analog information signal 12 is input to a continuous time analog-to-digital converter (CT ADC) circuit 14. The CT ADC circuit 14 is constituted by two comparators that operate to compare the analog information signal 12 to two references Vhigh and Vlow. The values for Vhigh and Vlow are two consecutive quantization levels which surround (i.e., are higher and lower than, respectively) the value of the input signal. The CT ADC circuit 14 functions to detect an event where a change in the amplitude of the analog information signal 12 increases or decreases beyond the thresholds defined by the Vhigh and Vlow references, respectively. In response to this change, the CT ADC circuit 14 generates a token formed by a pair of signals 16. The first signal 16a in the pair, referred to as the Change signal, is a short duration pulse that indicates that the event occurred (for example, that one of the thresholds defined by the Vhigh and Vlow references has been crossed by the changing analog information signal 12). The second signal 16b of the pair, referred to as the up/down (or UD) signal, is a single bit digital signal having a first logic value (for example, logic high or "1") if the changing analog information signal 12 crosses the threshold defined by the Vhigh reference and, conversely, having a second logic value (for example, logic low or "0") if the changing analog information signal 12 crosses the threshold defined by the Vlow reference. The pair of signals 16 are then processed using some form of a digital signal processing circuit 18. The processing performed may, for example, include filtering operations. For example, in the context where the analog information signal is an audio signal, the filtering operations performed on the pair of signals 16 may be tailored to certain frequency bands of interest to human speech. The digital signal processing circuit 18 may then further process the digital signals output from the filtering operations for the purpose of performing certain application tasks such as voice activity detection (VAD).

The output of a CT DSP filter is a numerical representation of the amplitude of the analog information signal 12. Those skilled in the art understand that the amplitude at any given instant of time, given its asynchronous nature in continuous time processing, does not provide any meaningful information that can be used in connection with VAD processing. It is accordingly necessary to determine the instantaneous power of the digital signal output from the CT DSP filter. The instantaneous power is then useful to the DSP circuit 18 in connection with the extraction of spectral information necessary for the VAD process.

There is a need in the art for an efficient means for making the instantaneous power estimation in a CT DSP system.

SUMMARY

In an embodiment, a circuit comprises: an input configured to receive a continuous time digital signal processing (CT DSP) token comprising a first signal indicating a change has occurred and a second signal indicating a direction of the change; an amplitude generation circuit that generates an amplitude value x in response to said token; and a power estimation circuit configured to generate a digital power signal as a function of said amplitude value x using the following formula: $x^2 \pm 2x+1$.

In an embodiment, a method comprises: receiving a continuous time digital signal processing (CT DSP) token comprising a first signal indicating a change has occurred and a second signal indicating a direction of the change; generating an amplitude value x in response to said token; and estimating power as a function of said amplitude value x using the following formula: $x^2 \pm 2x+1$.

BRIEF DESCRIPTION OF THE DRAWINGS

For a better understanding of the embodiments, reference will now be made by way of example only to the accompanying figures in which.

DETAILED DESCRIPTION

Figure 1:
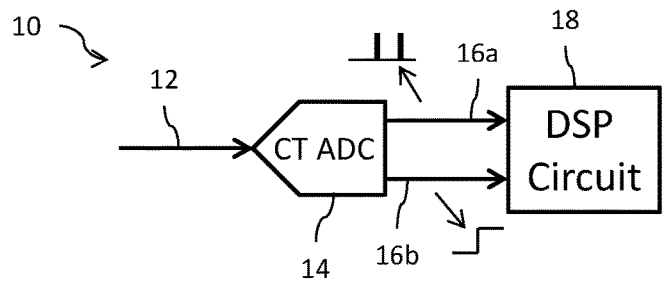
FIG. 1 is a block diagram of an example continuous time digital signal processing (CT DSP) system.
Figure 2:
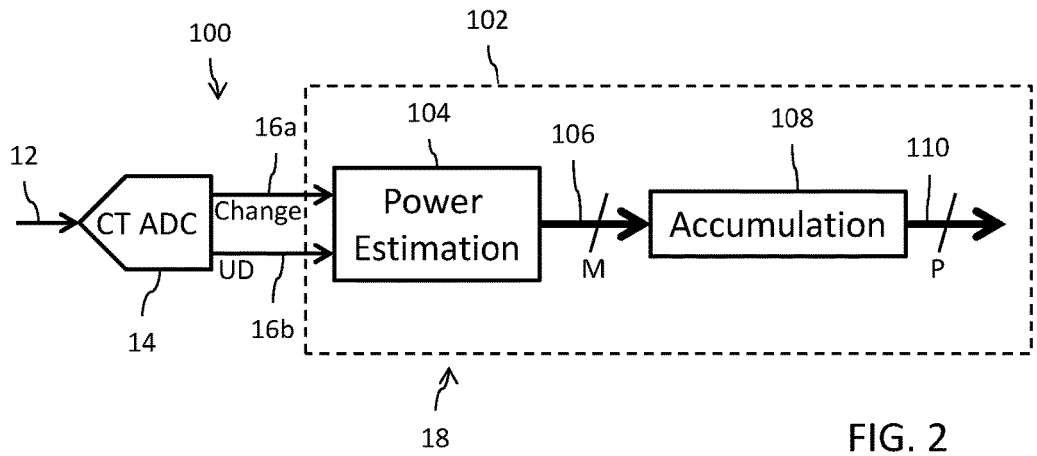
FIG. 2 is a block diagram of a CT DSP system including an energy estimator.

Reference is now made to FIG. 2 which shows a block diagram of a continuous time digital signal processing (CT DSP) system 100 with a DSP circuit 18 that implements an energy estimation function 102. A continuous time analog-to-digital converter (CT ADC) circuit 14 receives an analog information signal 12 and functions to detect a change event where the amplitude of the analog information signal 12 increases or decreases beyond thresholds defined by Vhigh and Vlow references, respectively, which have values corresponding to two consecutive quantization levels surrounding the value of the input signal. In response to detecting the change event, the CT ADC circuit 14 generates a token formed by a pair of signals 16 including a first signal 16a, referred to as the Change signal, that is a short duration pulse indicating that the event occurred, and a second signal 16b, referred to as the up/down (or UD) signal, that is a single bit digital signal indicating the change direction (logic high or "1" if the analog information signal 12 crosses the Vhigh threshold and logic low or "0" if the analog information signal 12 crosses the Vlow threshold). The pair of signals 16 are input to an instantaneous power estimation circuit 104 which generates an M-bit digital power signal 106 having a value which is indicative of the instantaneous power of the analog information signal 12. An accumulation circuit 108 accumulates the digital power signal 106 to generate a P-bit energy signal 110 having a value which is indicative of the energy of the analog information signal 12. In this context, P>M.

The pair of signals 16 may be digitally processed by the DSP circuit 18 to generate an N-bit digital signal x(n) having a value corresponding to an amplitude of the analog information signal 12. In this context, n is an index for the sequence of tokens that are generated over time. Due to the nature of the CT DSP operation, the amplitude value will vary only one least significant bit (LSB) at a time (i.e., +1 or −1) with each incrementation of the index n corresponding to the detection of a change. Thus, the current amplitude value x(n), derived from the current token, may be represented as: $x(n)=x(n-1)\pm1$, wherein $x(n-1)$ is the immediately preceding amplitude value, derived from the immediately preceding token.

The instantaneous power of a signal is proportional to the square of its amplitude, and thus for an amplitude x(n) the instantaneous power is given by $x(n)^2$, where: $x(n)^2=(x(n-1)\pm1)^2$.

The instantaneous power can then be computed using the binomial square formula as: $x(n)^2=x(n-1)^2\pm2x(n-1)+1$, with the instantaneous power $x(n)^2$ then output as the M-bit digital power signal 106.

Figure 3:
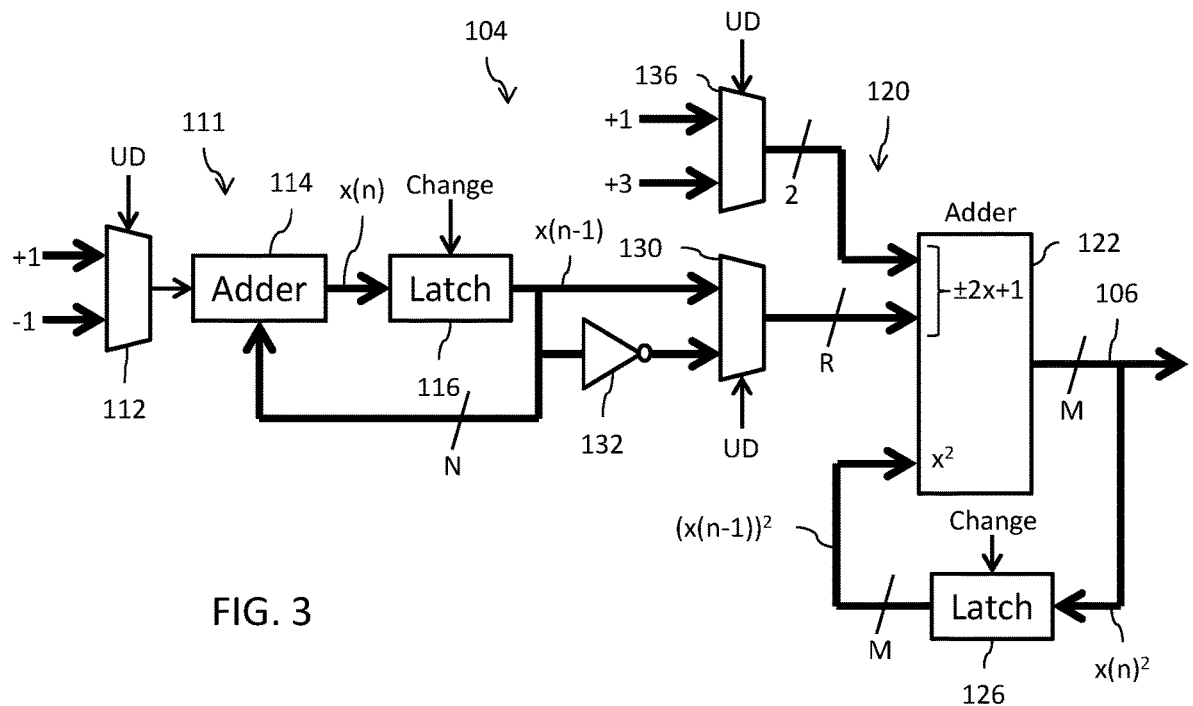
FIG. 3 is a circuit diagram of a first embodiment for the instantaneous power estimation circuit.

Reference is now made to FIG. 3 which shows a circuit diagram of a first embodiment for the instantaneous power estimation circuit 104. The pair of signals 16 are input to an amplitude generation circuit 111 that generates the current amplitude value x(n) and the immediately preceding amplitude value x(n−1). The amplitude generation circuit 111 includes a multiplexer 112 having a first input configured to receive a +1 digital value and a second input configured to receive a −1 digital value. The selection made by the multiplexer 112 is controlled by the second (up/down—UD) signal 16b. An N-bit digital adder circuit 114 receives the output of the multiplexer 112 and a feedback signal which is the immediately preceding amplitude value x(n−1). The output of the adder circuit 114, which is equal to x(n−1)+1 if the UD signal 16b is logic 1 or equal to x(n−1)−1 if the UD signal 16b is logic 0, generates the current amplitude value x(n). An N-bit digital latch circuit 116 operates to latch the current amplitude value x(n) in response to the pulse of the first (Change) signal 16a and the output of the latch 116 is then the immediately preceding amplitude value x(n−1) which is fed back to the adder circuit 114.

The instantaneous power estimation circuit 104 further includes an arithmetic processing circuit 120 which performs the arithmetic operation for calculating $x(n)^2$ in accordance with the equation $x(n-1)^2\pm2x(n-1)+1$. The arithmetic processing circuit 120 includes an M-bit digital adder circuit 122 with a first input configured to receive a first digital signal corresponding to bits <M−1:0> of the adder, a second input configured to receive a second digital signal corresponding to bits <R−1:0> of the adder, and a third input configured to receive a third digital signal corresponding to bits <1:0> of the adder. The first digital signal corresponds to the $x^2$ component of the instantaneous power calculation, while the second and third digital signals correspond to the ±2x+1 component of the instantaneous power calculation.

The output from the adder circuit 122 is the M-bit digital power signal 106 having a value indicative of the calculated instantaneous power $x(n)^2$ of the signal 12. An M-bit digital latch circuit 126 operates to latch the M-bit digital power signal 106 $(x(n)^2)$ from the output of the digital adder circuit 122 in response to the pulse of the first (Change) signal 16a and outputs the M-bit signal $x(n-1)^2$ applied to the first input of the digital adder circuit 122 to provide the $x^2$ component for the arithmetic operation to calculate the instantaneous power. A multiplexer 130 has a first input configured to receive the N-bit immediately preceding amplitude value x(n−1) and a second input configured to receive a logic complement of the N-bit immediately preceding amplitude value x(n−1) generated by inverter circuit 132. The selection made by the multiplexer 130 is controlled by the second (up/down—UD) signal 16b. The output of the multiplexer 130, which is equal to positive 2 times x(n−1) if the UD signal 16b is logic 1 or relates to making the negative 2 times x(n−1) calculation if the UD signal 16b is logic 0, is applied to the second input of the digital adder circuit 122 in connection with providing the ±2x+1 component for the arithmetic operation to calculate the instantaneous power. A multiplexer 136 has a first input configured to receive a +1 digital value and a second input configured to receive a +3 digital value. The selection made by the multiplexer 136 is controlled by the second (up/down—UD) signal 16b. The output of the multiplexer 136, which is a 2-bit digital signal having a value of +1 if the UD signal 16b is logic 1 or is a 2-bit digital signal having a value of +3 if the UD signal 16b is logic 0, is applied to the third input of the digital adder circuit 122 in connection with providing the ±2x+1 component for the arithmetic operation to calculate the instantaneous power.

In a first operating scenario where $x(n)=x(n-1)+1$, the UD signal 16b is logic 1 because the detected change in the input signal 12 is an increase crossing Vhigh, and the multiplexer 130 is controlled to select the first input with the N-bit immediately preceding amplitude value x(n−1). To apply the value of +2x(n−1) as required for the instantaneous power $x(n)^2$ calculation to the adder circuit 122, the multiply by positive 2 operation is simply implemented in hardware at the output of the multiplexer by left shifting the N-bits of the immediately preceding amplitude value x(n−1) and adding a logic 0 bit at the least significant bit (LSB) position to form the R-bit input signal to the second input of the adder circuit 122 (where R=N+1). Thus, bits <N−1:0> of the multiplexer 130 are mapped by hardwire connections to bits <R−1:1> of the adder 122 with bit<0> of the adder 122 wired to logic low. Here, the multiplexer 136 will select the 2-bit digital signal having a value of +1 in response to the UD signal 16b at logic 1 to provide the +1 part of the +2x(n−1)+1 component for the instantaneous power calculation.

In a second operating scenario where $x(n)=x(n-1)-1$, the UD signal 16b is logic 0 because the detected change in the input signal 12 is a decrease crossing Vlow, and the multiplexer 130 is controlled to select the second input with the logical invert of the N-bit immediately preceding amplitude value x(n−1). To understand why this is performed, consider that the two's complement of x(n−1) is used to perform the multiply by negative 2 operation. In this context, the two's complement of a number x is referred to as $C_2^x$, where $C_2^x=C_1^x+1$, with $C_1^x$ being the one's complement (i.e., the logical invert) of the number x. So, the inverter circuit 132 provides the one's complement of the N-bit immediately preceding amplitude value x(n−1). To effectuate the multiplication by 2 as required for the instantaneous power $x(n)^2$ calculation, it is noted that $-2x(n-1)=2*C_2^{x(n-1)}=2*$ $C_1^{x(n-1)}+2$. In other words, this is 2 times the logical invert of the N-bit immediately preceding amplitude value $x(n-1)$ plus a digital value of +2. The first part of the foregoing operation for the multiply by negative 2 operation is simply implemented in hardware at the output of the multiplexer by left shifting the logical invert of the N-bits of the immediately preceding amplitude value $x(n-1)$ and adding a logic 0 bit at the least significant bit (LSB) position to form the R-bit input signal to the second input of the adder circuit 122 (where R=N+1). Thus, bits <N−1:0> of the multiplexer 130 are mapped by hardwire connection to bits <R−1:1> of the adder 122 with bit<0> of the adder 122 wired to logic low. The second part of the foregoing operation for the +2 addition to complete the negative multiplication of $-2x(n-1)$ is addressed by using the multiplexer 136 to select the 2-bit digital signal having a value of +3 in response to the UD signal 16b at logic 0 as this will mathematically provide both the +1 part of the $+2x(n-1)+1$ component for the instantaneous power calculation and the +2 part needed to complete the $-2x(n-1)$ operation.

Figure 4:
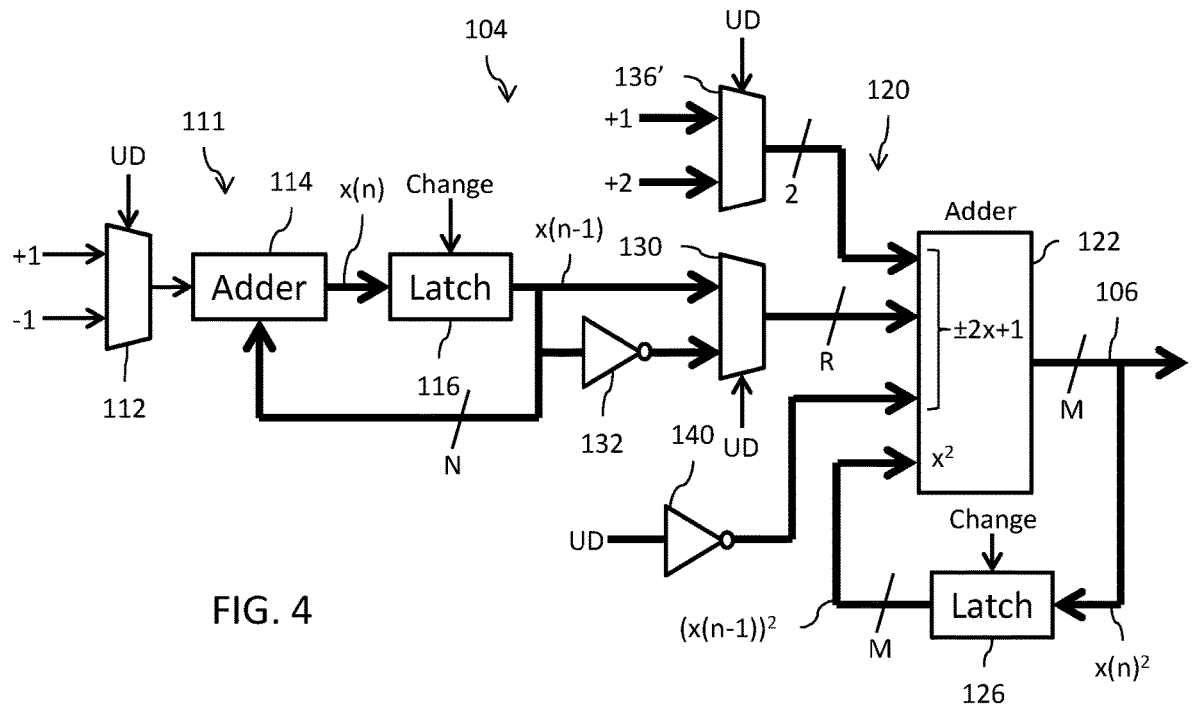
FIG. 4 is a circuit diagram of a second embodiment for the instantaneous power estimation circuit.

Reference is now made to FIG. 4 which shows a circuit diagram of a second embodiment for the instantaneous power estimation circuit 104. The pair of signals 16 are input to an amplitude generation circuit 111 that generates the current amplitude value $x(n)$ and the immediately preceding amplitude value $x(n-1)$. The amplitude generation circuit 111 includes a multiplexer 112 having a first input configured to receive a +1 digital value and a second input configured to receive a −1 digital value. The selection made by the multiplexer 112 is controlled by the second (up/down—UD) signal 16b. An N-bit digital adder circuit 114 receives the output of the multiplexer 112 and a feedback signal which is the immediately preceding amplitude value $x(n-1)$. The output of the adder circuit 114, which is equal to $x(n-1)+1$ if the UD signal 16b is logic 1 or equal to $x(n-1)-1$ if the UD signal 16b is logic 0, generates the current amplitude value $x(n)$. An N-bit digital latch circuit 116 operates to latch the current amplitude value $x(n)$ in response to the pulse of the first (Change) signal 16a and the output of the latch 116 is then the immediately preceding amplitude value $x(n-1)$ which is fed back to the adder circuit 114.

The instantaneous power estimation circuit 104 further includes an arithmetic processing circuit 120 which performs the arithmetic operation for calculating $x(n)^2$ in accordance with the equation $x(n-1)^2 \pm 2x(n-1)+1$. The arithmetic processing circuit 120 includes an M-bit digital adder circuit 122 with a first input configured to receive a first digital signal corresponding to bits <M−1:0> of the adder, a second input configured to receive a second digital signal corresponding to bits <R−1:1> of the adder, a third input configured to receive a third digital signal corresponding to bits <1:0> of the adder, and a fourth input configured to receive a fourth digital signal corresponding to bit <0> of the adder. The first digital signal corresponds to the $x^2$ component of the instantaneous power calculation, while the second, third and fourth digital signals correspond to the $\pm 2x+1$ component of the instantaneous power calculation. The output from the adder circuit 122 is the M-bit digital power signal 106 having a value indicative of the calculated instantaneous power $x(n)^2$ of the signal 12. An M-bit digital latch circuit 126 operates to latch the M-bit digital power signal 106 ($x(n)^2$) from the output of the digital adder circuit 122 in response to the pulse of the first (Change) signal 16a and outputs the M-bit signal $x(n-1)^2$ applied to the first input of the digital adder circuit 122 to provide the $x^2$ component for the arithmetic operation to calculate the instantaneous power. A multiplexer 130 has a first input configured to receive the N-bit immediately preceding amplitude value $x(n-1)$ and a second input configured to receive a logic complement of the N-bit immediately preceding amplitude value $x(n-1)$ generated by inverter circuit 132. The selection made by the multiplexer 130 is controlled by the second (up/down—UD) signal 16b. The output of the multiplexer 130, which is equal to positive 2 times $x(n-1)$ if the UD signal 16b is logic 1 or relates to making the negative 2 times $x(n-1)$ calculation if the UD signal 16b is logic 0, is applied to the second input of the digital adder circuit 122 in connection with providing the $\pm 2x+1$ component for the arithmetic operation to calculate the instantaneous power. A multiplexer 136' has a first input configured to receive a +1 digital value and a second input configured to receive a +2 digital value. The selection made by the multiplexer 136' is controlled by the second (up/down—UD) signal 16b. The output of the multiplexer 136', which is a 2-bit digital signal having a value of +1 if the UD signal 16b is logic 1 or is a 2-bit digital signal having a value of +2 if the UD signal 16b is logic 0, is applied to the third input of the digital adder circuit 122 in connection with providing the $\pm 2x+1$ component for the arithmetic operation to calculate the instantaneous power. A single bit logic inverter 140 has an input configured to receive the UD signal 16b and a single bit output is coupled to the fourth input of the digital adder circuit 122 in connection with providing the $\pm 2x+1$ component for the arithmetic operation to calculate the instantaneous power.

In a first operating scenario where $x(n)=x(n-1)+1$, the UD signal 16b is logic 1 because the detected change in the input signal 12 is an increase crossing Vhigh, and the multiplexer 130 is controlled to select the first input with the N-bit immediately preceding amplitude value $x(n-1)$. To apply the value of $+2x(n-1)$ as required for the instantaneous power $x(n)^2$ calculation to the adder circuit 122, the multiply by positive 2 operation is simply implemented in hardware at the output of the multiplexer by left shifting the N-bits of the immediately preceding amplitude value $x(n-1)$ and having the inverter circuit 140 apply a logic 0 bit at the least significant bit (LSB) position to form the R-bit input signal to the second input of the adder circuit 122 (where P=N+1). Thus, bits <N−1:0> of the multiplexer 130 are mapped to bits <R−1:1> of the adder 122 with bit<0> of the adder 122 connected to the output of the inverter circuit 140. Here, the multiplexer 136' will select the 2-bit digital signal having a value of +1 in response to the UD signal 16b at logic 1 to provide the +1 part of the $+2x(n-1)+1$ component for the instantaneous power calculation.

In a second operating scenario where $x(n)=x(n-1)-1$, the UD signal 16b is logic 0 because the detected change in the input signal 12 is a decrease crossing Vlow, and the multiplexer 130 is controlled to select the second input with the logical invert of the N-bit immediately preceding amplitude value $x(n-1)$. To understand why this is performed, consider that the two's complement of $x(n-1)$ is used to perform the multiply by negative 2 operation. In this context, the two's complement of a number x is referred to as $C_2^x$, where $C_2^x=C_1^x+1$, with $C_1^x$ being the one's complement (i.e., the logical invert) of the number x. So, the inverter circuit 132 provides the one's complement of the N-bit immediately preceding amplitude value $x(n-1)$. To effectuate the multiplication by 2 as required for the instantaneous power $x(n)^2$ calculation, it is noted that $-2x(n-1)=2*C_2^{x(n-1)}=2*C_1^{x(n-1)}+2$. In other words, this is 2 times the logical invert of the N-bit immediately preceding amplitude value $x(n-1)$ plus a digital value of +2. The first part of the foregoing operation for the multiply by negative 2 operation is simply implemented in hardware at the output of the multiplexer by left shifting the logical invert of the N-bits of the immediately preceding amplitude value x(n−1). Thus, bits <N−1:0> of the multiplexer 130 are mapped to bits <R−1:1> of the adder 122 (where R=N+1). The second part of the foregoing operation for the +2 addition to complete the negative multiplication of −2x(n−1) is addressed by using the multiplexer 136' to select the 2-bit digital signal having a value of +2 in response to the UD signal 16b at logic 0. The inverter circuit 140 will also apply a logic 1 bit at the least significant bit (LSB) position of the adder 122 in order to provide the +1 part of the +2x(n−1)+1 component for the instantaneous power calculation.

Figure 5:
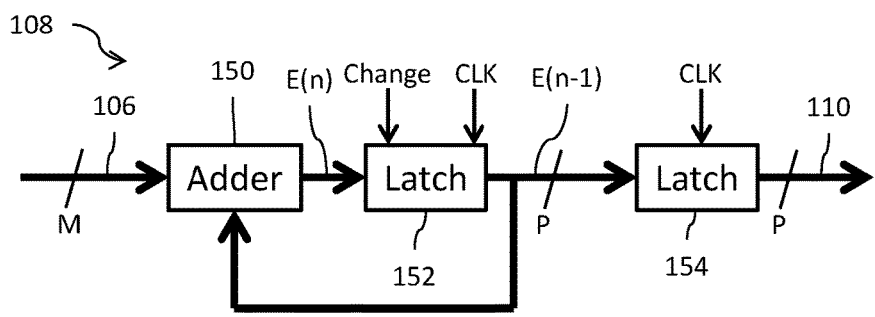
FIG. 5 is a circuit diagram of a first embodiment for the accumulation circuit.

FIG. 5 is a circuit diagram of a first embodiment for the accumulation circuit 108 which functions to accumulate the M-bit digital power signal 106. A P-bit adder circuit 150 receives the M-bit digital power signal 106 and a feedback signal which is the immediately preceding value of the accumulated energy signal E(n−1). The output of the adder circuit 150, which is equal to the sum of the M-bit digital power signal 106 and a feedback signal, produces a current value of the accumulated energy signal E(n). This current value is latched by a P-bit digital latch circuit 152 in response to the pulse of the first (Change) signal 16a to output the immediately preceding value of the accumulated energy signal E(n−1) which is fed back to the adder circuit 150. The accumulated energy signal E(n−1) is latched by a P-bit digital latch circuit 154 in response to an edge of a low frequency (for example, 10-100 Hz) clock signal CLK. The same edge of the clock signal CLK further causes a reset of the P-bit latch circuit 152. An advantage of the FIG. 5 accumulation circuit 108 is that output of the P-bit energy signal 110 can be synchronized to the operation of downstream circuitry of the DSP circuit 18.

Figure 6:
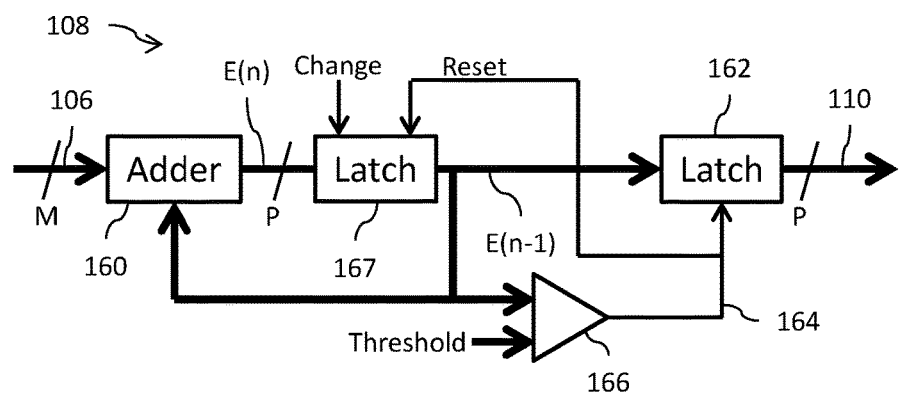
FIG. 6 is a circuit diagram of a second embodiment for the accumulation circuit.

FIG. 6 is a circuit diagram of a second embodiment for the accumulation circuit 108 which functions to accumulate the M-bit digital power signal 106. A P-bit adder circuit 160 receives the M-bit digital power signal 106 and a feedback signal which is the immediately preceding value of the accumulated energy signal E(n−1). The output of the adder circuit 160, which is equal to the sum of the M-bit digital power signal 106 and the feedback signal, produces the accumulated value of the accumulated energy signal E(n). This accumulated value is latched by a P-bit latch circuit 167 in response to the pulse of the first (Change) signal 16a to output the immediately preceding value of the accumulated energy signal E(n−1) which is fed back to the adder circuit 150. The P-bit latch circuit 167 is reset by a reset signal. The output of latch 167 is latched by a P-bit digital latch circuit 162 in response to assertion of a control signal 164. The control signal 164 is generated by a comparator circuit 166 which operates to compare the accumulated value of the accumulated energy signal E(n−1) to a threshold value. When the threshold is exceeded, the control signal 164 is asserted. The assertion of the control signal 164 further causes a reset of the latch circuit 167. An advantage of the FIG. 6 accumulation circuit 108 is that output of the P-bit energy signal 110 is transmitted for downstream processing by the DSP circuit 18 on an event driven basis, wherein the event concerns the accumulation of a sufficient or significant amount of energy as defined by the threshold value.

Figure 7:
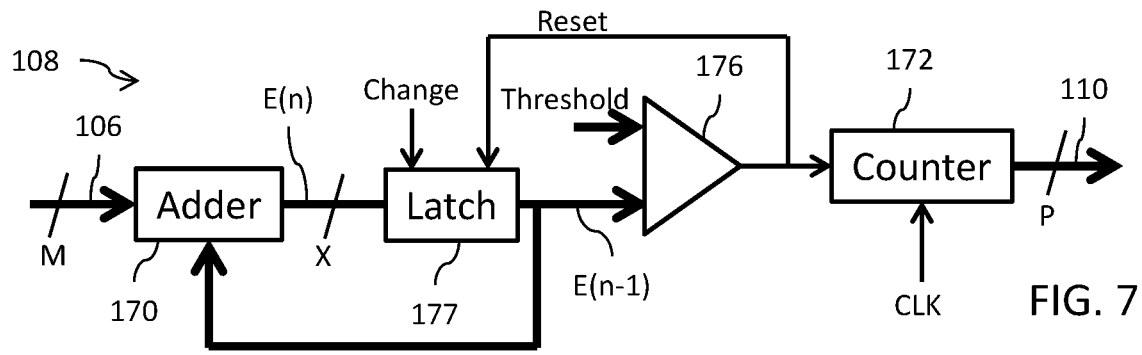
FIG. 7 is a circuit diagram of a third embodiment for the accumulation circuit.

FIG. 7 is a circuit diagram of a third embodiment for the accumulation circuit 108 which functions to accumulate the M-bit digital power signal 106. An X-bit adder circuit 170 receives the M-bit digital power signal 106 and a feedback signal which is the immediately preceding value of the accumulated energy signal E(n−1). The output of the adder circuit 170, which is equal to the sum of the M-bit digital power signal 106 and the feedback signal, produces the accumulated value of the accumulated energy signal E(n) that is latched by a latch circuit 177 in response to the pulse of the first (Change) signal 16a to produce the immediately preceding value of the accumulated energy signal E(n−1). This accumulated value from the latch 177 is compared to a threshold value by a comparator circuit 176, with the comparator circuit 176 generating an output signal which pulses each time the accumulated value exceeds the threshold value. The assertion of the output signal from the comparator circuit 176 further causes a reset of the latch 177. A counter circuit 172 counts the pulses of the output signal from the comparator circuit 176 for output as the P-bit energy signal 110. In this particular implementation, it will be noted that the value P can be less than M (and X). The counter circuit 172 is reset in response to an edge of a low frequency (for example, 20-50 Hz) clock signal CLK. An advantage of the FIG. 7 accumulation circuit 108 is a reduction in the output rate for the P-bit energy signal 110 which can utilize a smaller number of bits to communicate the accumulated energy information.

Figure 8:
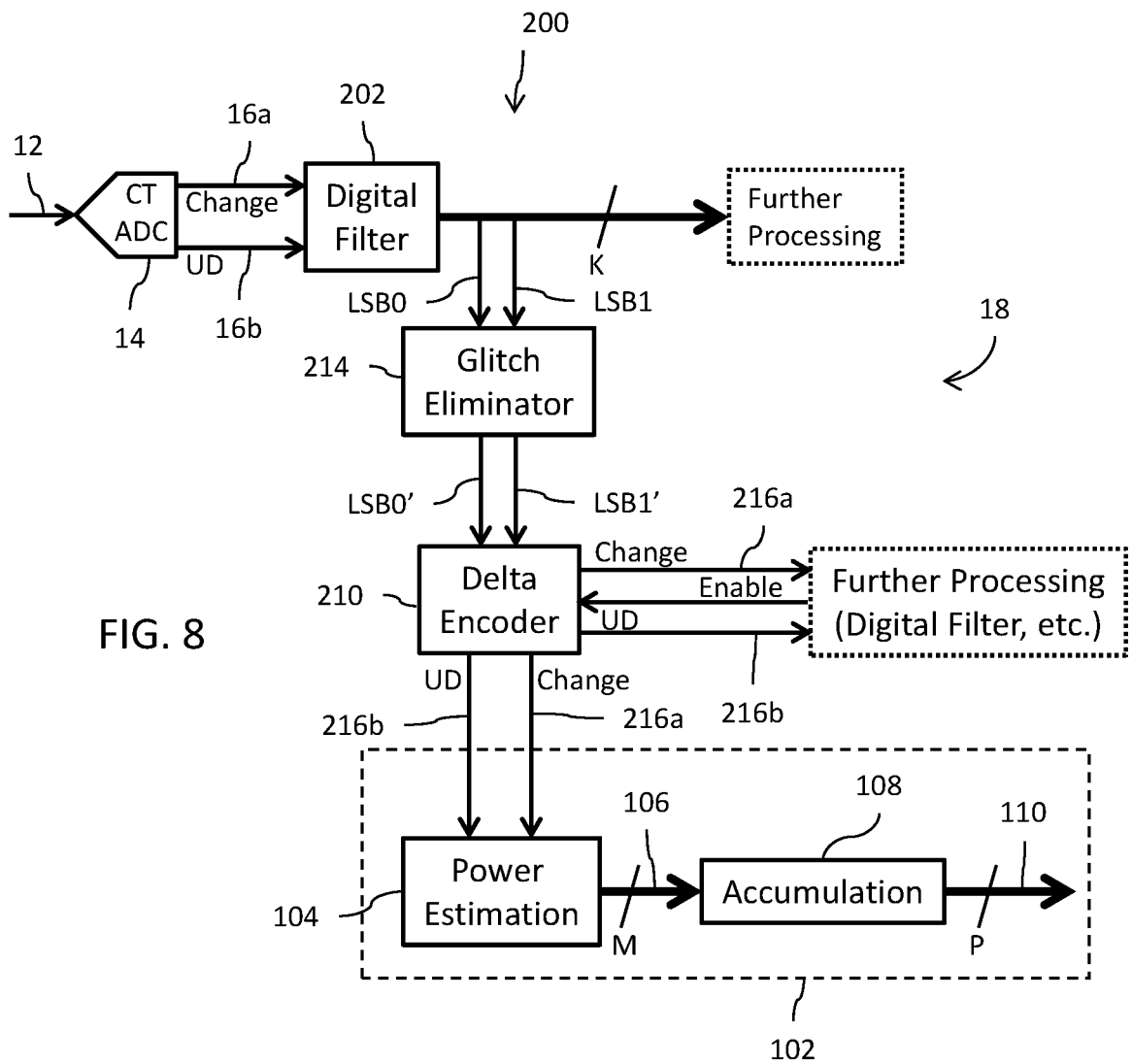
FIG. 8 is a block diagram of a CT DSP system including an energy estimator.

Reference is now made to FIG. 8 which shows a block diagram of a continuous time digital signal processing (CT DSP) system 200 with a DSP circuit 18 that implements an energy estimation function 102. A continuous time analog-to-digital converter (CT ADC) circuit 14 receives an analog information signal 12 from a source (not explicitly shown) which may, for example, comprise a sensor or a transducer. In an embodiment, the analog information signal 12 may comprise an audio signal and, in particular, a voice signal. The CT ADC circuit 14 functions to detect a change event where the amplitude of the analog information signal 12 increases or decreases beyond thresholds defined by Vhigh and Vlow references, respectively, which have values corresponding to two consecutive quantization levels surrounding the value of the input signal. In response to detecting the change event, the CT ADC circuit 14 generates a token formed by a pair of signals 16 including a first signal 16a, referred to as the Change signal, that is a short duration pulse indicating that the event occurred, and a second signal 16b, referred to as the up/down (or UD) signal, that is a single bit digital signal indicating the change direction (logic high or "1" if the analog information signal 12 crosses the Vhigh threshold and logic low or "0" if the analog information signal 12 crosses the Vlow threshold).

Analysis of the analog information signal 12 by the CT DSP system 200 may be frequency dependent. Such is typically the case, for example, when analyzing a voice signal where it is important to isolate a certain frequency range of interest. To accomplish this frequency isolation, the CT DSP system 200 further includes a digital CT DSP finite impulse response (FIR) filter 202 which implements a basic filtering function such as a low pass or band pass processing. The CT DSP FIR filter 202 may be of any suitable order and is generally implemented using delay elements, multiplier-accumulators and an output adder in a manner well known to those skilled in the art. The output of the CT DSP FIR filter 202 is a K-bit digital signal 204 providing a numerical representation of only the amplitude of the filtered signal. It will be understood that the illustrated CT DSP FIR filter 202 may represent a bank of cascaded filters with the K-bit digital signal 204 being only one of many filtered output signals. The K-bit digital signal 204 may be further processed by the DSP circuit 18.

Given that the input signal 16 to the CT DSP FIR filter 202 only varies by one least significant bit (LSB) at a time, and assuming unity gain in the passband, the K-bit digital signal 204 output from the CT DSP FIR filter 202 should also not vary by more than one LSB with each detected change event. It is accordingly possible to convert the K-bit digital signal 204 into a token formed by a pair of signals 216 including a first signal 216a, referred to as the Change signal, that is a short duration pulse indicating that a change in the LSB occurred, and a second signal 216b, referred to as the up/down (or UD) signal, that is a single bit digital signal indicating the change direction (logic high or "1" if the K-bit digital signal 204 varies with an increment by 1 and logic low or "0" if the K-bit digital signal 204 varies with a decrement by 1).

Figure 9:
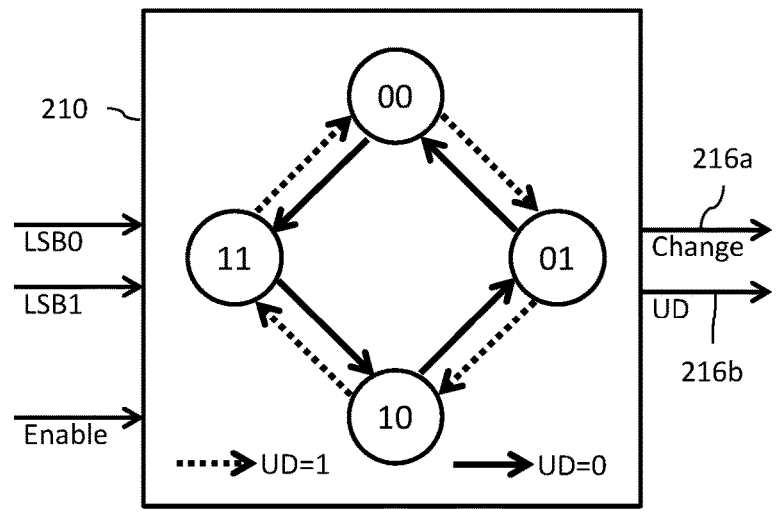
FIG. 9 is state diagram for the operation of a delta encoder circuit.

The conversion operation to generate the pair of signals 216 is performed by a delta encoder circuit 210 that examines the logic states of the two least significant bits LSB0, LSB1 of the K-bit digital signal 204 to detect instances of a change and determine the direction (up/down) of that detected change. Operation of the delta encoder circuit 210 may be better understood by reference to the state diagram shown in FIG. 9. The delta encoder circuit 210 has four states corresponding to the four possible values of the two least significant bits LSB0, LSB1. The delta encoder circuit 210 further has two outputs corresponding to the pair of signals 216. For any given state the delta encoder circuit 210 can only change in two possible directions, because it is understood that the K-bit digital signal 204 will only vary one LSB at the time. When the change in state is in the clockwise direction (for example, 00→01→10→11→00), the first (Change) signal 216a is pulsed in response to the state change and the second signal 216b will be at logic 1 indicating that the detected change in an increment by 1. Conversely, when the change in state is in the counterclockwise direction (for example, 00→11→10→01→00), the first (Change) signal 216a is pulsed in response to the state change and the second signal 216b will be at logic 0 indicating that the detected change in a decrement by 1.

In an embodiment, the delta encoder circuit 210 includes an input receiving a control signal (Enable) that when asserted enables the delta encoder circuit 210 to change states. This enable signal is not required in all implementations. However, it may be used where appropriate and necessary, for example, in the case where the Enable signal is generated by further processing circuitry (such as with a CT filter) in a circuit implementation where cascaded continuous time filtering is performed.

It will be noted that the K-bit digital signal 204 output by the CT DSP FIR filter 202 can be subject to very closely spaced transitions. These glitches can be classified into two categories. A first category relates to glitches caused by delays in the combinational logic of the filter. These are "false" values and must be ignored (removed). A second category relates to glitches arising from the event-driven nature of the signal. These are "true" transitions and could be retained for evaluation in the signal processing. However, these high-speed transitions do not carry much information and can thus be removed as well. The glitch removal is accomplished by a glitch eliminator circuit 214 that processes the two least significant bits LSB0, LSB1 of the K-bit digital signal 204 in a manner which will eliminate the possibility for successive Up and Down events to appearing within a granular delay time corresponding to the next processing stage. The glitch eliminator circuit 214 at the output of the CT DSP FIR filter 202 will both suppress the glitches and adapt the event rate to the signal bandwidth. The output of the glitch eliminator circuit 214 are modified least significant bits LSB0', LSB1' that are applied to the inputs of the delta encoder circuit 210.

Figure 10:
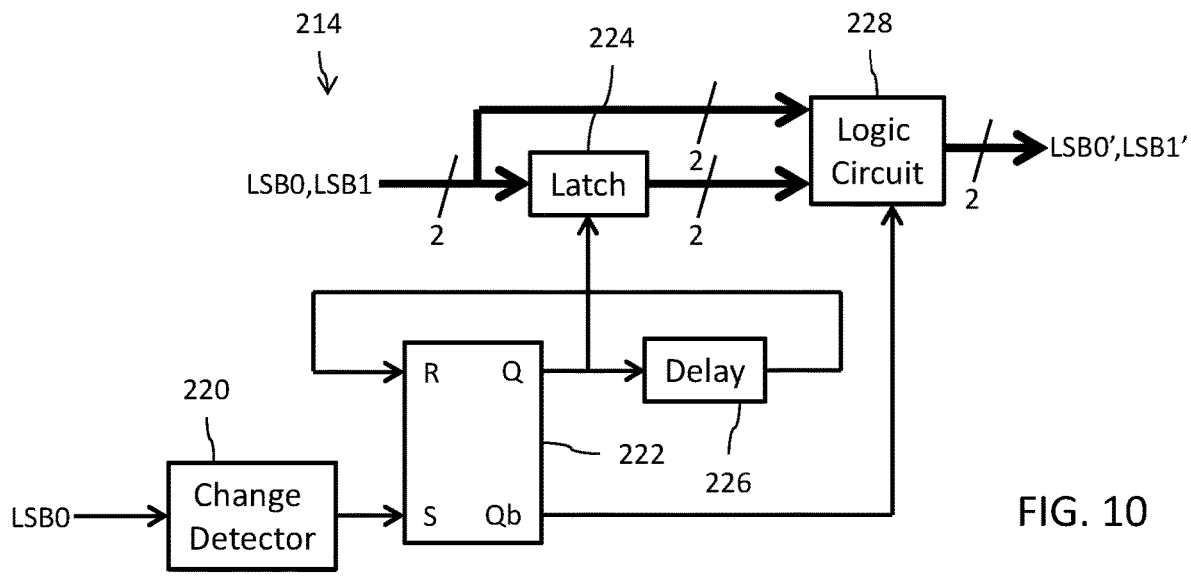
FIG. 10 is a circuit diagram for an embodiment of the glitch eliminator circuit.

Reference is now made to FIG. 10 which shows a circuit diagram for an embodiment of the glitch eliminator circuit 214. The solution to eliminate glitches at the output of the CT DSP FIR filter 202 exploits the property that the output can only vary one bit at the time. A change detector circuit 220 detects when LSB0 changes logic state. In response thereto, a pulse is generated and applied to the set S input of a set-reset (SR) latch circuit 222. As a result, the true Q output of the SR latch circuit 222 is asserted and applied to the clock input of a 2-bit latch circuit 224 which responds by latching the values LSB0 and LSB1 of the K-bit digital signal 204. The assertion of the true Q output of the SR latch circuit 222 is further applied to a delay circuit 226 with the delayed assertion being fed back to the reset R input of the set-reset (SR) latch circuit 222. As a result of the feedback with delay, the complement Qb output of the SR latch circuit 222 is then asserted to clock (enable) a logic circuit 228 to perform a comparison of the values of LSB0, LSB1 as stored in the 2-bit latch circuit 224 to the current values of LSB0, LSB1 present at the input of the glitch eliminator circuit 214. If the compared values are identical, the transition is considered valid and the values for LSB0, LSB1 are output as the values LSB0', LSB1' to the delta encoder. Conversely, if the compared values are different in any way, the transition is discarded, and the output LSB0, LSB1 from the glitch eliminator maintains its previous value. In this way, glitches causing changes in the values of LSB0, LSB1 which occur with a time period set by the length of the delay applied by delay circuit 226 are effectively ignored.

Reference is now once again made to FIG. 8. The pair of signals 216 are input to an instantaneous power estimation circuit 104 which generates an M-bit digital power signal 106 having a value which is indicative of the instantaneous power of the filtered analog information signal 12. The instantaneous power estimation circuit 104 may be implemented by a circuit as shown in FIG. 3 or FIG. 4 (described in detail herein) operating in response to the Change signal (i.e., first signal 216a) and the up/down (or UD) signal (i.e., second signal 216b) of the pair of signals 216. The instantaneous power estimation circuit 104 will determine the instantaneous power of the filtered analog information signal 12 and generate the M-bit digital power signal 106. An accumulation circuit 108 accumulates the digital power signal 106 to generate a P-bit energy signal 110 having a value which is indicative of the energy of the filtered analog information signal 12. The accumulation circuit 108 may be implemented by a circuit as shown in FIG. 5, FIG. 6 or FIG. 7 (described in detail herein).

In an extension of the circuit, the pair of signals 216 may be further processed. Such further processing may comprise, for example, processing of the signals 216 by a digital filter (like the filter 202 but having a different passband), followed by glitch elimination (like reference 214), delta encoding (like reference 210) and energy estimation (like reference function 102). In such a case, the further processing circuits can determine the energy of the filtered signal. This implementation with the glitch eliminator and delta encoder advantageously allows for the cascading of continuous time filters. The downstream digital filter within the further processing will generate the enable signal (Enable) for application to the delta encoder 210 to enable state change operation.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
    an input terminal configured to receive a continuous time digital signal processing (CT DSP) token comprising a first signal indicating occurrence of a change and a second signal indicating a direction of the change;
    an amplitude generation circuit that generates an amplitude value x in response to said token; and
    a power estimation circuit configured to generate a digital power signal as a function of said amplitude value x utilizing the following formula: $x^2 \pm 2x+1$.

2. The circuit of claim 1, further comprising a CT analog to digital converter (ADC) configured to generate the token in response to conversion of an analog information signal, and wherein the digital power signal provides an instantaneous estimated power of the analog information signal.

3. The circuit of claim 2, wherein the CT ADC processes the analog information signal to generate the first signal indicating occurrence of a change in said analog information signal and the second signal indicating whether the change is an increase beyond a high threshold level or a decrease beyond a low threshold level.

4. The circuit of claim 1, further comprising:
    a CT DSP filter circuit configured to filter an information signal and generate a digital output signal; and
    a conversion circuit configured to generate the token in response to conversion of the digital output signal, and wherein the digital power signal provides an instantaneous estimated power of the filtered information signal.

5. The circuit of claim 4, wherein the conversion circuit is a delta encoder circuit configured to process a plurality of bits of the digital output signal to generate the first signal indicating occurrence of a change in said plurality of bits and the second signal indicating whether the change in said plurality of bits is an increment or decrement.

6. The circuit of claim 5, further comprising a glitch eliminator circuit configured to eliminate changes in said plurality of bits of the digital output signal which occur within a delay time period.

7. The circuit of claim 5, wherein said plurality of bits of the digital output signal are the two least significant bits of the digital output signal.

8. The circuit of claim 5, further comprising an additional CT DSP filter circuit coupled to the delta encoder circuit to receive the first signal indicating occurrence of a change in said plurality of bits and the second signal indicating whether the change in said plurality of bits is an increment or decrement, said additional CT DSP filter circuit configured to perform a filtering operation and generate an additional digital output signal.

9. The circuit of claim 1, wherein the power estimation circuit comprises an adder circuit including:
    a first input terminal configured to receive a third signal;
    a second input terminal configured to receive a fourth signal;
    a third input terminal configured to receive a fifth signal;
    wherein an output of the adder circuit is applied to the first input terminal as the third signal;
    a first multiplexer having a first input coupled to receive the amplitude value x and a second input coupled to receive a logic inversion of the amplitude value x and an output applied to the second input terminal as the fourth signal; and
    a second multiplexer having a first input coupled to receive a first fixed value and a second input configured to receive a second fixed value and an output applied to the third input terminal as the fifth signal;
    wherein selection by the first and second multiplexers is controlled by a logic state of the second signal of the token.

10. The circuit of claim 9, wherein the first fixed value is +1 and the second fixed value is +3.

11. The circuit of claim 9, wherein an application of the output of the fourth signal to the second input terminal comprises implementing a left shift.

12. The circuit of claim 11, wherein implementation of the left shift is made through a hardwiring of bits.

13. The circuit of claim 9, further comprising a latch circuit configured to latch the output of the adder circuit to generate the third signal, wherein actuation of the latch circuit is controlled by the first signal of the token.

14. The circuit of claim 1, wherein the power estimation circuit comprises an adder circuit including:
    a first input terminal configured to receive a third signal;
    a second input terminal configured to receive a fourth signal;
    a third input terminal configured to receive a fifth signal;
    a fourth input terminal configured to receive a sixth signal;
    wherein an output of the adder circuit is applied to the first input terminal as the third signal;
    a first multiplexer having a first input coupled to receive the amplitude value x and a second input coupled to receive a logic inversion of the amplitude value x and an output applied to the second input terminal as the fourth signal;
    a second multiplexer having a first input coupled to receive a first fixed value and a second input configured to receive a second fixed value and an output applied to the third input terminal as the fifth signal; and
    an inverter circuit configured to invert the second signal of the token to generate the sixth signal;
    wherein selection by the first and second multiplexers is controlled by a logic state of the second signal of the token.

15. The circuit of claim 14, wherein the first fixed value is +1 and the second fixed value is +2.

16. The circuit of claim 14, wherein an application of the output of the fourth signal to the second input terminal comprises implementing a left shift.

17. The circuit of claim 16, wherein implementation of the left shift is made through a hardwiring of bits.

18. The circuit of claim 14, further comprising a latch circuit configured to latch the output of the adder circuit to generate the third signal, wherein actuation of the latch circuit is controlled by the first signal of the token.

19. The circuit of claim 1, further comprising an accumulation circuit configured to accumulate the digital power signal and output an energy signal.

20. The circuit of claim 19, wherein the accumulation circuit comprises:
    an adder circuit configured to add the digital power signal over a time period and periodically output an accumulation of the digital power signal from said adder circuit as said energy signal.

21. The circuit of claim 19, wherein the accumulation circuit comprises:
an adder circuit configured to add the digital power signal to generate an accumulation signal;
a comparator configured to compare the accumulation signal to a threshold; and
an output circuit configure to output the accumulation signal as said energy signal in response to the comparator determining that the accumulation signal exceeds the threshold.

22. The circuit of claim 19, wherein the accumulation circuit comprises:
an adder circuit configured to add the digital power signal to generate an accumulation signal;
a comparator configured to compare the accumulation signal to a threshold and generate a pulse signal each time the accumulation signal exceeds the threshold; and
a counter configured to count the pulse signal and periodically output a count value as said energy signal.

23. A method, comprising:
receiving a continuous time digital signal processing (CT DSP) token comprising a first signal indicating occurrence of a change and a second signal indicating a direction of the change;
generating an amplitude value x in response to said token; and
estimating power as a function of said amplitude value x utilizing the following formula: $x^2 \pm 2x + 1$.

24. The method of claim 23, further comprising converting an analog information signal in CT to generate the token in response to conversion of an analog information signal, wherein the estimating power comprises generating an instantaneous estimated power of the analog information signal.

25. The method of claim 23, further comprising:
filtering an information signal generate a digital output signal; and
converting the digital output signal to generate the token, wherein the estimating power comprises generating an instantaneous estimated power of the filtered information signal.

26. The method of claim 23, wherein converting comprises delta encoding a plurality of bits of the digital output signal to generate the token.

27. The method of claim 26, further comprising eliminating glitches in said plurality of bits of the digital output signal which occur within a delay time period.

28. The method of claim 26, further comprising further filtering the token produced by said delta encoding to generate a further digital output signal.

29. The method of claim 23, wherein the estimating power comprises:
adding third, fourth and fifth signals to generate an output signal;
applying the output signal as the third signal;
first selecting between the amplitude value x and a logic inversion of the amplitude value x to generate the fourth signal; and
second selecting between a first fixed value and a second fixed value to generate the fifth signal;
wherein first and second selecting is controlled by a bit of the token.

30. The method of claim 29, wherein the first fixed value is +1 and the second fixed value is +3.

31. The method of claim 30, wherein the estimating power comprises:
adding third, fourth, fifth and sixth signals to generate an output signal;
applying the output signal as the third signal;
first selecting between the amplitude value x and a logic inversion of the amplitude value x to generate the fourth signal;
second selecting between a first fixed value and a second fixed value to generate the fifth signal; and
inverting a bit of the token to generate the sixth signal;
wherein selection by the first and second multiplexers is controlled by said bit of the token.

32. The method of claim 31, wherein the first fixed value is +1 and the second fixed value is +2.

33. The method of claim 23, further comprising accumulating the estimated power to output an energy signal.

34. The method of claim 33, wherein the accumulating comprises:
adding the estimated power over a time period and periodically outputting an accumulation value from said adding as said energy signal.

35. The method of claim 33, wherein the accumulating comprises:
adding the estimated power to generate an accumulation signal;
comparing the accumulation signal to a threshold; and
outputting the accumulation signal as said energy signal in response to the accumulation signal exceeding the threshold.

36. The method of claim 33, wherein the accumulating comprises:
adding the estimated power to generate an accumulation signal;
comparing the accumulation signal to a threshold;
generating a pulse signal each time the accumulation signal exceeds the threshold; and
counting the pulse signal to periodically output a count value as said energy signal.

* * * * *